United States Patent
Kim

(10) Patent No.: US 8,818,307 B2
(45) Date of Patent: Aug. 26, 2014

(54) TUNER INPUT CIRCUIT

(71) Applicant: LG Innotek Co., Ltd., Seoul (KR)

(72) Inventor: Do Yul Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/716,945

(22) Filed: Dec. 17, 2012

(65) Prior Publication Data

US 2013/0165062 A1    Jun. 27, 2013

(30) Foreign Application Priority Data

Dec. 27, 2011    (KR) .......................... 10-2011-0142988

(51) Int. Cl.
*H04B 1/18*    (2006.01)

(52) U.S. Cl.
USPC .................. 455/178.1; 455/191.1; 455/179.1; 455/333; 455/334

(58) Field of Classification Search
CPC .............. H04B 1/06; H04B 1/16; H04B 1/28; H03H 7/38; H03F 1/486; H03F 1/52
USPC ............. 455/130, 191.1, 341, 347, 77, 150.1, 455/178.1, 179.1, 333, 334
See application file for complete search history.

(56) References Cited

U.S. PATENT DOCUMENTS

| 8,229,367 | B2 * | 7/2012 | Chan et al. ...................... 455/78 |
| 2003/0103006 | A1 * | 6/2003 | Yamada ................. 343/700 MS |
| 2006/0154638 | A1 * | 7/2006 | Zheng et al. .................. 455/302 |
| 2008/0160948 | A1 * | 7/2008 | Kim ........................... 455/250.1 |

* cited by examiner

*Primary Examiner* — Tuan Pham

(74) *Attorney, Agent, or Firm* — Birch, Stewart, Kolasch & Birch, LLP

(57) ABSTRACT

Disclosed is a tuner input circuit. The tuner input circuit includes an integrated including a low noise amplifier and a band pass filter embedded in one chip.

10 Claims, 3 Drawing Sheets

TUNER INPUT CIRCUIT

BACKGROUND

1. Field of the Invention

The disclosure relates to a tuner input circuit, and more particularly to a tuner input circuit in which a low noise amplifier (LNA) and a band pass filter (BPF) allowing a broadcast signal received from an antenna to pass therethrough before inputting to a tuner are integrated with each other in one chip, thereby realizing a device in small size.

2. Discussion of the Background

In general, static electricity is collected into a human body or machine to raise the potential difference and then suddenly flows toward a lower potential, which is called an electrostatic discharge (ESD). The ESD is to discharge high voltage of about several kV to several tens of kV for a short time of several µs.

A device affected by the ESD must be equipped with a protective circuit against the ESD so that the device obtains the resistance against the ESD. For example, when high voltage is applied to a device such as a tuner through an antenna due to the ESD, since the ESD voltage is greater than the internal voltage of a circuit device provided in the tuner, the internal circuits of the tuner may be broken, so that the failure of the tuner may be caused. Accordingly, in order to prevent the failure of the tuner, an ESD protection circuit must be added.

In addition, until the signal received through the antenna is input to the tuner, the signal passes through a CB trap, an ESD diode, and an LNA. Since the above devices include capacitors and inductors, the devices may serve as limitation factors in realizing a PCB in micro-size.

In addition, the above devices represent different performances due to the difference in a time constant and a pattern therebetween. Further, the interference exists between multichannels, so that the reliability of the devices must be improved.

FIG. 1 is a block diagram showing a tuner input circuit according to the related art.

Referring to FIG. 1, the tuner input circuit according to the related art includes capacitors connected between an antenna (ANT) and a tuner 200 to cut off a DC component of a signal input from the antenna (ANT), a CB trap 100 to trap a signal having a specific frequency band among signals passing through the capacitors, an EST diode 150 having a cathode connected between the capacitor and the connection terminal of the tuner 200 and an anode connected to the ground, and an LNA 160.

As shown in FIG. 1, since the above devices include a plurality of capacitors and a plurality of inductors, the devices occupy the most part of a PCB space. Accordingly, the devices may serve as limitation factors in realizing the device in micro-size.

SUMMARY

The embodiment of the disclosure provides a tuner input circuit which can be realized in small size by providing an LNA and a BPF in one integrated circuit.

According to the embodiment of the disclosure, there is provided a tuner input circuit including an integrated circuit including an LNA and a BPF embedded in one chip.

As described above, according to the embodiment of the disclosure, the tuner input circuit can be realized in small size by providing the LNA and the BPF in one integrated circuit.

DETAILED DESCRIPTION OF THE EMBODIMENTS

Figure 1:
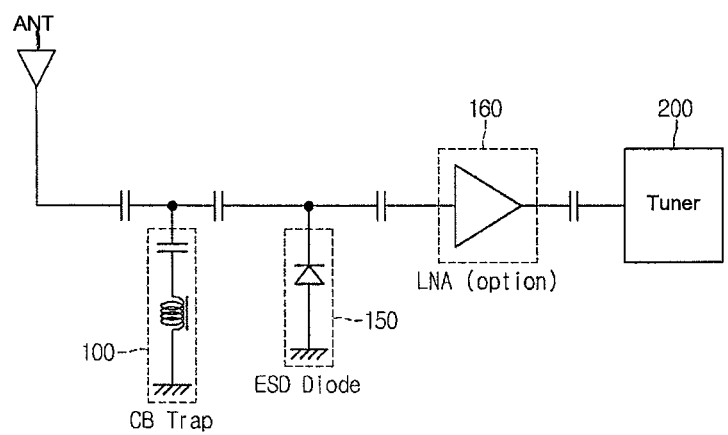
FIG. 1 is a block diagram showing a tuner input circuit according to the related art.

Hereinafter, exemplary embodiments of the disclosure will be described in detail with reference to accompanying drawings. The details of other embodiments are contained in the detailed description and accompanying drawings. The advantages, the features, and schemes of achieving the advantages and features of the disclosure will be apparently comprehended by those skilled in the art based on the embodiments, which are detailed later in detail, together with accompanying drawings. The same reference numerals will be assigned to the same elements throughout the whole description.

Figure 2:
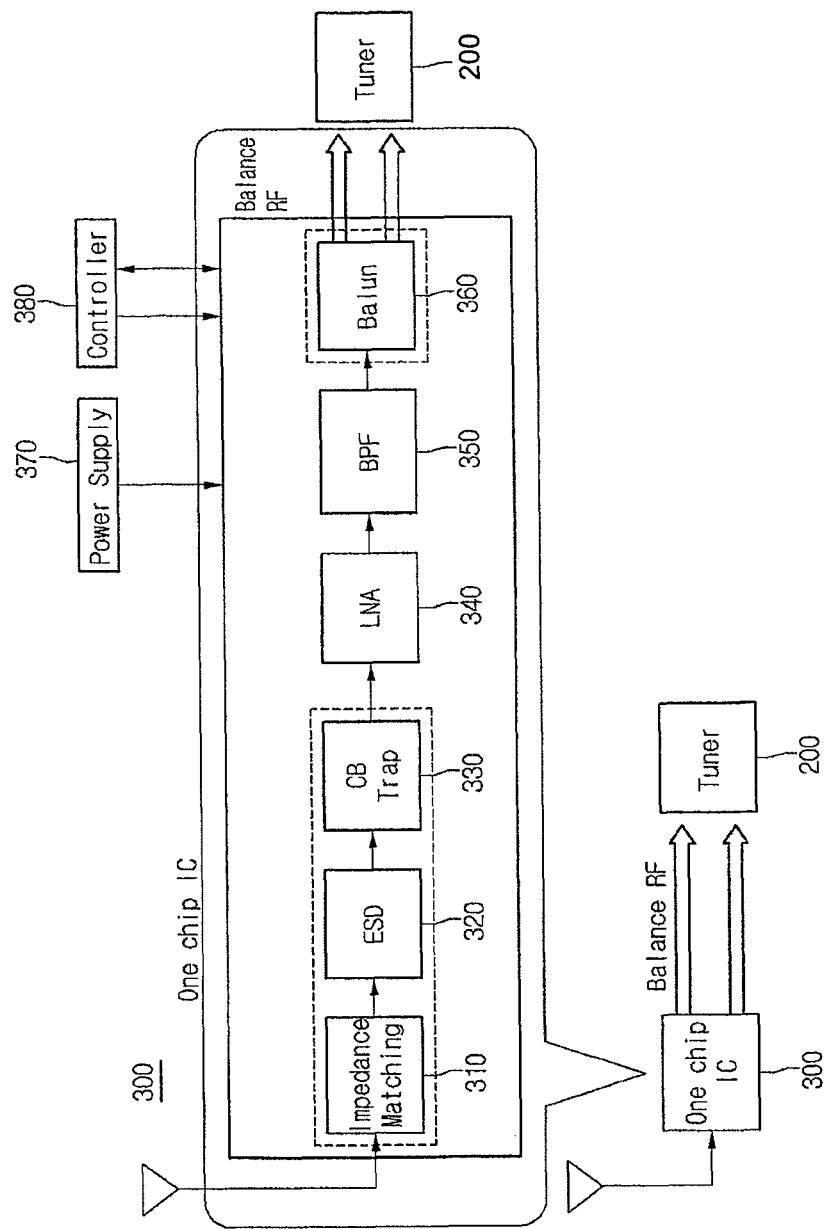
FIG. 2 is a block diagram showing a tuner input circuit according to the embodiment of the disclosure.

FIG. 2 is a block diagram showing a tuner input circuit according to the embodiment of the disclosure. An integrated circuit 300 according to the embodiment may be formed in the form of a single chip. The integrated circuit 300 may be provided therein with a low noise amplifier (LNA) 340 and a band pass filter (BPF) module 350.

In addition, a signal received through an antenna may passes through an impedance matching module 310, an electrostatic discharge (ESD) module 320, and a CB trap 330 before the signal is input into the LNA 340. The input return loss of −10 dB or more may be satisfied by the impedance matching module 310. In order to omit additional impedance matching, the length and the thickness of a pattern from the input of an antenna to the integrated circuit 300 may be adjusted, and may be modified according to designs.

The ESD module 320 has high voltage of about several kV to about several tens of kV and discharges the voltage for a short time. The ESD module 320 prevents the application of the overvoltage.

The signal, which has passed through the ESD module 320, may be input to the CB trap 330. The CB trap 330 traps and filters a specific frequency band of a signal which has passed through the ESD module 320.

The impedance matching module 310, the ESD module 320, and the CB trap 330 may be selectively formed at the outside of the integrated circuit 300.

The signal, which has passed through the CB trap 330, is input into the LNA 340. The LNA 340 selectively operates with the characteristic of a low noise ratio and a high amplification degree and low-noise amplifies an RF signal received from the antenna The LNA 340 selectively operates by DC voltage supplied thereto. If the received RF signal represents a weak electric field, the LNA 340 low-noise amplifies the received RF signal. If the received RF signal represents a strong electric field, the LNA 340 is turned off to by-pass the RF signal. In other words, a by-pass path may be formed at the LNA 340.

The signal, which has passed through the LNA 340, is input to the BPF module 350. Since the BPF module 350 cuts off remaining signals except for a signal having a specific frequency band, the frequency band is changed according to the channel selection. Accordingly, the BPF module 350 may communicate with a controller 380 to change the frequency band. The communication scheme may include an international institute of communication (IIC) scheme, but the embodiment is not limited thereto.

Figure 3:
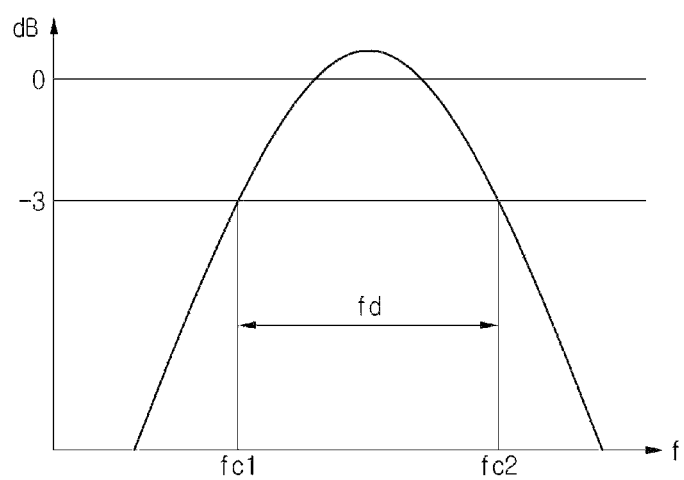
FIG. 3 is a graph showing a frequency characteristic of a band pass filter.

FIG. 3 is a graph showing a frequency characteristic of a band pass filter. As shown in FIG. 2, the band pass filter has a characteristic of passing only one frequency band. The band pass filter has two cutoff frequencies fc1 and fc2 serving as upper and lower limit frequencies that may easily pass through the band pass filter. In the case of a narrow frequency band, only the central frequency may be marked. The central frequency may be changed through the communication with the controller 380.

Signals, which have passed through the BPF module 350, may be distributed by a Balun 360. The Balun 360 is a passive device to convert a balanced signal into an unbalanced signal, or to convert an unbalanced signal into a balanced signal. The Balun 360 refers to a matching transformer used when feeding power through a coaxial cable. The balanced signal refers to a signal transmitted when the ground surrounds a central signal line like a coaxial cable, and the unbalance signal refers to a signal transmitted when the ground is provided below or at both sides of the signal line like a PCB.

As described above, according to the embodiment of the disclosure, the tuner input circuit can be realized in micro-size by providing the LNA and the BPF in one integrated circuit.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A tuner input circuit comprising:
   an integrated circuit including a low noise amplifier, a band pass filter, an electrostatic discharge module and a CB trap embedded in one chip,
   wherein the electrostatic discharge module and the CB trap are provided at a front stage of the low noise amplifier, and
   wherein the CB trap is connected between the electrostatic discharge module and the low noise amplifier.

2. The tuner input circuit of claim 1, further comprising a controller connected to the band pass filter.

3. The tuner input circuit of claim 2, wherein the controller communicates with the band pass filter through an international institute of communication scheme.

4. The tuner input circuit of claim 1, further comprising a Balun connected with the band pass filter and constituting the integrated circuit.

5. The tuner input circuit of claim 1, wherein the low noise amplifier has a by-pass path.

6. An apparatus for receiving a broadcast signal, the apparatus comprising:
   an input module to input a signal received through an antenna; and
   a tuner to select a channel according to a signal output from the input module to output broadcasting information,
   wherein the input module includes an integrated circuit including a low noise amplifier, a band pass filter, an electrostatic discharge module and a CB trap embedded in one chip,
   wherein the electrostatic discharge module and the CB trap are provided at a front stage of the low noise amplifier, and
   wherein the CB trap is connected between the electrostatic discharge module and the low noise amplifier.

7. The apparatus of claim 6, further comprising a controller connected with the band pass filter.

8. The apparatus of claim 7, wherein the controller communicates with the band pass filter through an international institute of communication scheme.

9. The apparatus of claim 6, further comprising a Balun connected with the band pass filter and constituting the integrated circuit.

10. The apparatus of claim 6, wherein the low noise amplifier has a by-pass path.

* * * * *